(12) United States Patent
Kim et al.

(10) Patent No.: US 7,338,825 B2
(45) Date of Patent: Mar. 4, 2008

(54) STRUCTURE FOR OPTICAL DEVICE AND METHOD OF FABRICATING THE SAME

(75) Inventors: Sang Hyeob Kim, Daejeon (KR); Ki Chul Kim, Daejeon (KR); Hye Jin Kim, Daejeon (KR)

(73) Assignee: Electronics And Telecommunications Research Institute (KR)

( * ) Notice: Subject to any disclaimer, the term of this patent is extended or adjusted under 35 U.S.C. 154(b) by 148 days.

(21) Appl. No.: 11/190,284

(22) Filed: Jul. 26, 2005

(65) Prior Publication Data
US 2006/0118783 A1   Jun. 8, 2006

(30) Foreign Application Priority Data
Dec. 2, 2004   (KR) .................. 10-2004-0100429

(51) Int. Cl.
*H01L 21/00* (2006.01)
(52) U.S. Cl. .................. 438/31; 438/29; 438/32; 257/E33.068
(58) Field of Classification Search .................. 438/29, 438/31, 32; 257/E33.068
See application file for complete search history.

(56) References Cited

U.S. PATENT DOCUMENTS

| | | | |
|---|---|---|---|
| 5,258,630 A | | 11/1993 | Toyama et al. |
| 6,188,084 B1 | | 2/2001 | Kerber et al. |
| 6,781,160 B1 * | | 8/2004 | Tsai et al. .................. 257/98 |
| 6,903,505 B2 * | | 6/2005 | McNulty et al. ............. 313/504 |
| 7,012,363 B2 * | | 3/2006 | Weaver et al. ............. 313/504 |
| 2003/0111955 A1 * | | 6/2003 | McNulty et al. ............. 313/504 |
| 2003/0127973 A1 * | | 7/2003 | Weaver et al. ............. 313/504 |
| 2003/0136440 A1 * | | 7/2003 | Machida et al. ............. 136/243 |
| 2003/0184219 A1 * | | 10/2003 | Duggal et al. ............. 313/506 |
| 2004/0046497 A1 * | | 3/2004 | Schaepkens et al. ........ 313/506 |
| 2004/0061107 A1 * | | 4/2004 | Duggal ........................ 257/40 |
| 2006/0197413 A9 * | | 9/2006 | Takeuchi et al. ............. 310/328 |

FOREIGN PATENT DOCUMENTS

KR   10-0421147   2/2004

(Continued)

OTHER PUBLICATIONS

Applied Physics Letters, vol. 78, No. 1, Jan. 1, 2001, pp. 99-101.

(Continued)

*Primary Examiner*—Fernando L. Toledo
(74) *Attorney, Agent, or Firm*—Blakely Sokoloff Taylor & Zafman

(57) ABSTRACT

Provided are a structure for an optical device and method of fabricating the same. The structure includes: a light scattering layer producing nanoparticles due to externally provided thermal energy; a protective layer protecting the light scattering layer; and a capping layer disposed between the light scattering layer and the protective layer. As the light scattering layer is formed of nitride-oxide, an energy gap is increased to make the structure suitable for a high-speed electronic circuit, and a desired stoichiometric ratio can be easily obtained. Also, the capping layer prevents crystalline mismatch, thus the non-uniformity of elements is inhibited to maintain a stoichiometric state. As a result, a high-integrated high-speed electronic circuit, which is excellent in uniformity and reproducibility, can be easily embodied.

6 Claims, 2 Drawing Sheets

FOREIGN PATENT DOCUMENTS

KR  10-2004-0030359  4/2004
WO  WO 2004/088644 A1  10/2004

OTHER PUBLICATIONS

Applied Physics Letters, vol. 78, No. 17, Apr. 23, 2001, pp. 2417-2419.

Applied Physics Letters, vol. 78, No. 6, Feb. 5, 2001, pp. 790-792.

Juni Tominaga, "The application of silver oxide thin films to plasmon photonic devices", Institute of Physics Publishing, Journal of Physics Condensed Matter, vol. 15, No. 25, Jul. 2, 2003, pp. R1001-R1122, XP002446478, ISSN: 0953-8984.

* cited by examiner

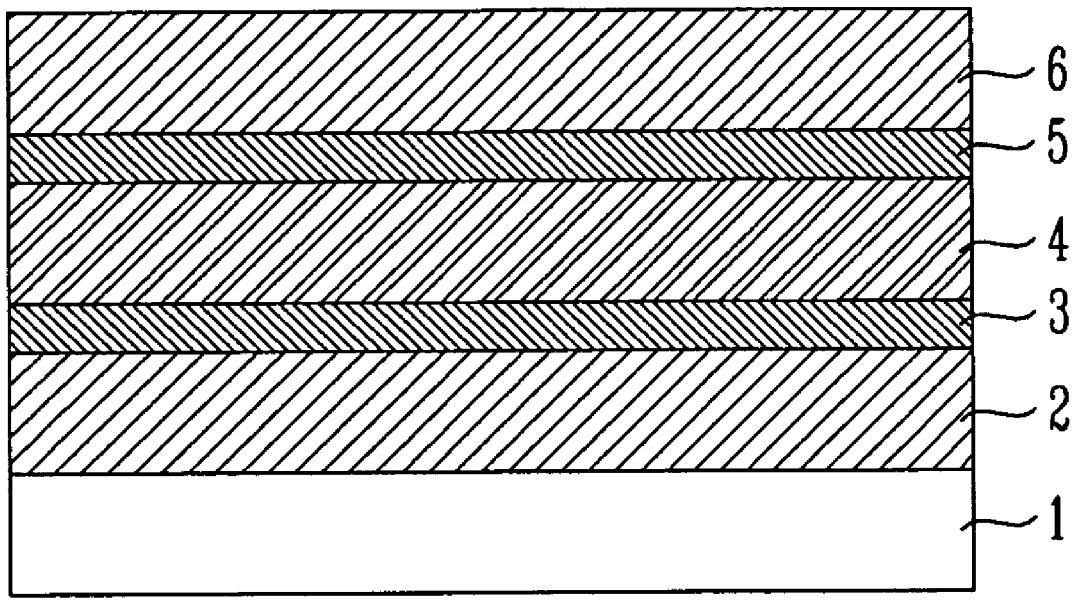

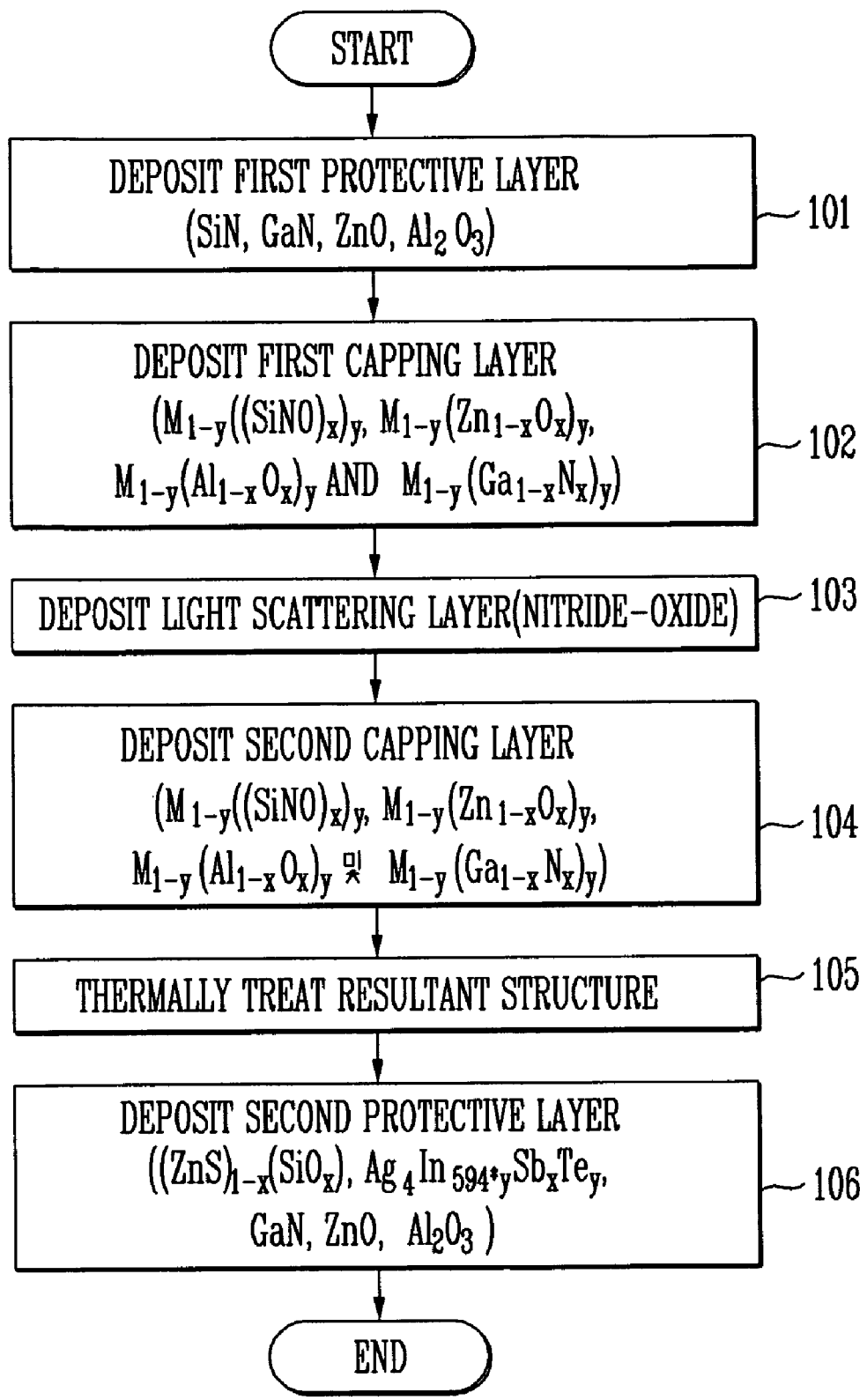

STRUCTURE FOR OPTICAL DEVICE AND METHOD OF FABRICATING THE SAME

CROSS-REFERENCE TO RELATED APPLICATION

This application claims priority to and the benefit of Korean Patent Application No. 2004-100429, filed Dec. 2, 2004, the disclosure of which is incorporated herein by reference in its entirety.

BACKGROUND

1. Field of the Invention

The present invention relates to a structure for an optical device and method of fabricating the same and, more specifically, to a structure for an optical device, which includes a light scattering layer for producing nanoparticles to scatter light, and method of fabricating the same.

2. Discussion of Related Art

A junction, which is associated with an essential technique for the configuration of an electronic circuit in semiconductor fabrication technologies, has actively been developed for several dozens of years. The junction may be mainly categorized into a pnp or npn junction, which is applied to a bipolar transistor in which signals are amplified by electron/s and holes, a Josephson junction, which is formed of superconductor-metal (insulator)-superconductor, and the likes.

A trilayer Josephson junction using YBCO is introduced by B. H. Moeckly ["All Y—Ba—Cu—O c-axis trilayer interface-engineered Josephson junctions", Appl. Phys. Lett., Vol. 78, pp.790-792, 2001]. According to B. H. Moeckly, a lower YBCO thin layer is deposited on a $LaAlO_3$ substrate, and the surface of the lower YBCO thin layer is modified using Ar plasma. Thereafter, an upper YBCO thin layer is deposited in vacuum, thereby forming a trilayer Josephson junction. However, the complicated oxide structure of the resultant YBCO Josephson junction is highly sensitive to the amount of doped oxygen. For this reason, when the YBCO Josephson junction is used in the fabrication of highly integrated circuits, it is difficult to obtain uniform and reproducible junctions.

In other words, the use of conventional pnp or npn junctions or Josephson junctions precludes the implementation of highly integrated electronic circuits owing to the sensitiveness of a stoichiometric ratio caused by compound oxide materials.

In recent years, extensive studies have been made of the amplification of signals in optical fibers based on an optical nonlinear effect. However, in order to elevate the sensitivity of an amplifier, it is necessary to increase a distance between optical fibers as well as the length of the optical fibers. As a result, the amplifier needs to be fabricated to a larger size so that it cannot be easily applied to the highly integrated electronic circuits.

Meanwhile, a technique of accumulating or amplifying surface plasmons, i.e., optical signals using a light scattering layer for producing nanoparticles is proposed by J. Tominaga et al. ["Local plasmon photonic transistor", Appl. Phys. Lett., Vol. 78, pp.2417-2419, 2001]. In this technique, when low-power laser or heat is irradiated on the light scattering layer to produce nanoparticles, surface plasmons are accumulated according to a variation in the transmissivity of the nanoparticles. Also, when the transmissivity of the nanoparticles is varied by controlling the power of laser or heat, the accumulated surface plasmons are externally scattered so that an optical amplification effect can be achieved.

J. Tominaga et al. discloses a thin film transistor, which includes a protective layer, a light scattering layer, and a protective layer. The light scattering layer is formed of AgOx, and each protective layer is formed of $ZnS$—$SiO_2$. In this structure, surface plasmons are amplified about 60 times as much as conventional bipolar transistors by using a red light laser having a power of 1.5 to 3.5 mW. However, the above-described structure allows oxygen and nitrogen to leak out from the light scattering layer during the generation of the nanoparticles, thus crystalline mismatch occurs.

SUMMARY OF THE INVENTION

The present invention is directed to a structure for an optical structure, in which a light scattering layer is formed of nitride-oxide, and a capping layer is interposed between the light scattering layer and a protective layer to prevent crystalline mismatch, and method of fabricating the same.

One aspect of the present invention is to provide a structure for an optical device including: a light scattering layer producing nanoparticles due to externally provided thermal energy; a protective layer for protecting the light scattering layer; and a capping layer disposed between the light scattering layer and the protective layer.

Another aspect of the present invention is to provide a method of fabricating a structure for an optical device. The method includes: forming a first protective layer on a substrate by depositing one of oxide and nitride; forming a first capping layer on the first protective layer by depositing a material, which is doped with one selected from the group consisting of Si, Ta, W, Zn, Be, Li, and Al; forming a light scattering layer on the first capping layer by depositing nitride-oxide; forming a second capping layer on the light scattering layer by depositing a material, which is doped with one selected from the group consisting of Si, Ta, W, Zn, Be, Li, and Al; thermally treating the resultant structure to enable the generation of nanoparticles; and forming a second protective layer on the second capping layer by depositing one of oxide and nitride.

The oxide for forming the first and second protective layers may be one of $Zn_{1-x}O_x$ and $Al_{1-x}O_x$, and the nitride for forming the first and second protective layers may be one of SiN and $Ga_{1-x}N_x$.

The material, which is doped with one selected from the group consisting of Si, Ta, W, Zn, Be, Li, and Al, is one of $M_{1-y}((SiNO)_x)_y$, $M_{1-y}(Zn_{1-x}O_x)_y$, $M_{1-y}(Al_{1-x}O_x)_y$, and $M_{1-y}(Ga_{1-x}N_x)_y$, and the nitride-oxide is $(MN)_{1-x}O_x$ (M=Si, Ta, W, Zn, Be, Li, Al).

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 1 is a cross sectional view of a structure for an optical device according to an embodiment of the present invention; and FIG. 2 is a flowchart illustrating exemplary operations for fabricating a structure for an optical device according to an embodiment of the present invention.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

FIG. 1 is a cross sectional view of a structure for an optical device according to an embodiment of the present invention.

The structure for the optical device is disposed on a substrate 1 and includes a light scattering layer 4, protective layers 2 and 6, and capping layers 3 and 5. The light scattering layer 4 produces nanoparticles due to externally produced light or thermal energy. The protective layers 2 and 6 serve to protect lower and upper portions of the light scattering layer 4. The capping layers 3 and 5 are disposed between the light scattering layer 4 and the protective layers 2 and 6, respectively, to prevent crystalline mismatch.

The light scattering layer 4 is formed of nitride-oxide or carbide-nitride. Here, the nitride-oxide is $(MN)_{1-x}O_x$ (M=Si, Ta, W, Zn, Be, Li, Al). For example, the nanoparticles may be formed of an inorganic element M, and the light scattering layer 4 may be formed of silicon nitride-oxide ($(Si_3N_4)_{1-x}O_x$, or $(SiO_2)_{1-x}N_x$)), tantalum nitride-oxide ($(Ta_2O_5)_{1-x}N_x$)), or tungsten carbide-oxide ($(WO)_{1-x}N_x$)), which can combine with the inorganic element M. The capping layers 3 and 5 may be formed of $M_{1-y}((SiNO)_x)_y$, $M_{1-y}(Zn_{1-x}O_x)_y$, $M_{1-y}(Al_{1-x}O_x)_y$ or $M_{1-y}(Ga_{1-x}N_x)_y$, which is doped with one of Si, Ta, W, Zn, Be, Li, and Al. The protective layers 2 and 6 may be formed of oxide or nitride. Here, the oxide for the protective layers 2 and 6 may be $Zn_{1-x}O_x$ or $Al_{1-x}O_x$, and the nitride therefor may be SiN or $Ga_{1-x}N_x$.

When laser or heat having a low power of 1 to 20 mW is irradiated on the above-described structure for the optical device, a portion of the light scattering layer 4 to which the thermal energy is applied is changed from an amorphous phase to a crystalline phase. Here, the transmissivity of the crystalline portion becomes higher than that of the amorphous portion.

In this case, when the power of laser or heat is increased above a predetermined critical value, the crystalline portion is changed into a nanoparticle phase. The transmissivity of nanoparticles becomes lower than that of the crystalline portion. Accordingly, surface plasmons are accumulated according to a variation in the transmissivity of the nanoparticles. In this case, once the power of laser or heat is increased above the critical value, surface plasmons are accumulated in inverse proportion to a distance between the surfaces of the nanoparticles and the surface of the light scattering layer 4.

Meanwhile, if the power of laser or heat is increased above or decreased below the critical value, the transmissivity of the nanoparticles can be further reduced. In further reducing the transmissivity of the nanoparticles, the accumulated surface plasmons are externally scattered so that an optical amplification effect can be obtained. In other words, the application of a power that exceeds the critical value leads to the generation of light scatterers, thus the accumulated surface plasmons are externally scattered. In this case, the light scatterers are reversibly generated or extinguished due to a laser power.

For example, in order to record a 200-nm record mark on a track, a red light laser with a predetermined power is irradiated on the light scattering layer 4, thus producing nanoparticles. Then, a blue light laser is transported onto the same track, and a modulation signal that is almost equal in frequency (i.e., 15 MHz) to a recorded signal is input at a power of 1.5 mW +0.1 mW. Thereafter, when a power of the red light laser is varied between 1.5 mW and 3.5 mW for the purpose of detection, the signal of the blue light laser is reflected on the nanoparticles and comes back. In this case, the intensity of the signal of the blue light laser is amplified by about 60 times.

In this process, surface plasmons are accumulated in a region that is about 100 nm deeper than the surface of the light scattering layer 4 and interact with local plasmons using the nanoparticles, thus causing optical amplification.

If the laser or thermal irradiation is interrupted, the generation of the nanoparticles is suppressed. Accordingly, since the area occupied by the amorphous portion of the light scattering layer 4 is increased more than the area occupied by the nanoparticles, the light scattering layer 4 approximates to the transmissivity of the amorphous portion and directly transmits incident laser so that a light scattering effect cannot be expected any more from the light scattering layer 4. The present invention is based on the principle that laser or heat is irradiated on an amorphous-phase nitride-oxide layer to thereby produce nanoparticles due to pyrolysis. Therefore, a thermal energy in excess of a critical value should be continuously applied to produce the nanoparticles. Although it depends on the characteristics of materials, because the nanoparticles are generated or extinguished according to the thermal energy, the function of a thermal energy source is very important.

Hereinafter, a method of fabricating a structure for an optical device according to the present invention will be described with reference to FIGS. 1 and 2.

In operation 101, oxide or nitride is deposited on a substrate 1 to have a thickness of 10 to 300 nm, thereby forming a first protective layer 2. The oxide may be $Zn_{1-x}O_x$ or $Al_{1-x}O_x$, and the nitride may be $Si_{1-x}N_x$ or $Ga_{1-x}N_x$. The $Zn_{1-x}O_x$, $Al_{1-x}O_x$, or $Ga_{1-x}N_x$ has the same crystalline structure and almost the same crystal constant as nitride-oxide $((MN)_{1-x}O_x)$ (M=Si, Ta, W, Zn, Be, Li, Al) used for a light scattering layer 4 as described below. Thus, the $Zn_{1-x}O_x$, $Al_{1-x}O_x$, or $Ga_{1-x}N_x$ is easily grown by an epitaxial growth process and also facilitates the epitaxial growth of the light scattering layer 4 formed of the nitride-oxide($(MN)_{1-x}O_x$).

In operation 102, $M_{1-y}((SiNO)_x)_y$, $M_{1-y}(Zn_{1-x}O_x)_y$, $M_{1-y}(Al_{1-x}O_x)_y$, or $M_{1-y}(Ga_{1-x}N_x)_y$ which is doped with any one of Si, Ta, W, Zn, Be, Li, and Al, is deposited on the first protective layer 2 to a thickness of 0.5 to 2 nm, thereby forming a first capping layer 3.

In operation 103, nitride-oxide $((MN)_{1-x}O_x)$ (M=Si, Ta, W, Zn, Be, Li, Al) or carbide-nitride is deposited on the first capping layer 3, thereby forming the light scattering layer 4. Here, an element M(M=Si, Ta, W, Zn, Be, Li, Al) contained in the nitride-oxide $((MN)_{1-x}O_x)$ has a very short diffusion distance. Therefore, by controlling the thickness of the nitride-oxide $((MN)_{1-x}O_x)$ to about 2 to 50 nm, nanoparticles can be easily produced even at a low-power laser. For example, the nitride-oxide may be silicon nitride-oxide $((Si_3N_4)_{1-x}O_x$ or $(SiO_2)_{1-x}N_x)$, or tantalum nitride-oxide $((Ta_2O_5)_{1-x}N_x)$, and the carbide-nitride may be tungsten carbide-oxide $((WO)_{1-x}N_x)$.

In operation 104, $M_{1-y}((SiNo)_x)_y$, $M_{1-y}(Zn_{1-x}O_x)_y$, $M_{1-y}(Al_{1-x}O_x)_y$, or $M_{1-y}(Ga_{1-x}N_x)_y$, which is doped with any one of Si, Ta, W, Zn, Be, Li, and Al, is deposited on the light scattering layer 4 to a thickness of 0.5 to 2 nm, thereby forming a second capping layer 5.

In operation 105, the resultant structure is thermally treated at a temperature of about 200 to 850° C. in an atmosphere of nitrogen, oxygen, and argon. In this case, the resultant structure is rapidly heated up to about 200 to 850° C., thermally treated for 5 to 100 seconds, and then rapidly cooled.

In operation 106, oxide or nitride is deposited on the second capping layer 5 to a thickness of about 10 to 300 nm, thereby forming a second protective layer 6. The oxide may be $(ZnS)_{1-x}(SiO_x)$, $Zn_{1-x}O_x$ or $Al_{1-x}O_x$, and the nitride may be $Ga_{1-x}N_x$. In another case, the second protective layer 6 may be formed of $Ag_4In_{594*y}SbxTe_y$.

The oxide ($Zn_{1-x}O_x$ or $Al_{1-x}O_x$) or the nitride ($Ga_{1-x}N_x$), which is used for the first and second protective layers 2 and 6, $M_{1-y}((SiNO)_x)_y$, $M_{1-y}(Zn_{1-x}O_x)_y$, $M_{1-y}(Al_{1-x}O_x)_y$ or $M_{1-y}(Ga_{1-x}N_x)_y$ doped with any one of Si, Ta, W, Zn, Be, Li, and Al, which is used for the first and second capping layers 3 and 5, and the nitride-oxide $((MN)_{1-x}O_x)$ (M=Si, Ta, W, Zn, Be, Li, Al), which is used for the light scattering layer 4, may be deposited using a sputtering process, a pulsed laser deposition (PLD) process, or an electronic beam (e-beam) evaporation process. During each deposition process, the substrate 1 is maintained at a temperature of about 25 to 400° C.

In the above-described process, if deposited layers are exposed to air, they may be contaminated and changed in properties. Accordingly, in order to prevent the contamination of the deposited layers, operations 101 through 106 may be performed in-situ.

In fabricating a device using the above-described structure, after the first capping layer 3 is formed, interconnections are formed using an ion milling process or a photolithography process. Also, after the second protective layer 6 is formed, electrode pads are formed using a photolithography process.

Since the nitride-oxide $((MN)_{1-x}O_x)$ (M=Si, Ta, W, Zn, Be, Li, Al), which is used for the light scattering layer 4, has a higher energy gap than conventional materials for an active layer, the structure for the optical device according to the present invention is advantageous to the fabrication of high-speed electronic circuits. Further, the element M (M=Si, Ta, W, Zn, Be, Li, Al) is efficiently combined with nitrogen and oxygen, so that an appropriate stoichiometric ratio can be easily obtained and a thin layer with good uniformity and reproducibility can be formed. Hence, a highly integrated electronic circuit can be easily embodied.

As explained thus far, the present invention provides a light scattering layer formed of nitride-oxide $((MN)_{1-x}O_x)$ (M=Si, Ta, W, Zn, Be, Li, Al) for producing nanoparticles to scatter light. Also, a capping layer formed of $M_{1-y}((SiNO)_x)_y$, $M_{1-y}(Zn_{1-x}O_x)_y$, $M_{1-y}(Al_{1-x}O_x)_y$, or $M_{1-y}(Ga_{1-x}N_x)_y$ is formed between the light scattering layer and a protective layer. Since the nitride-oxide $((MN)_{1-x}O_x)$ has a high energy gap, it is quite suitable for a high-speed electronic circuit. In addition, an element M (M=Si, Ta, W, Zn, Be, Li, Al) is efficiently combined with nitrogen and oxygen, so that an appropriate stoichiometric ratio can be easily obtained. Further, because the capping layer combines with oxygen and nitrogen, which leak out from the light scattering layer during the production of the nanoparticles, the capping layer can prevent crystalline mismatch. As a result, the non-uniformity of elements is inhibited to maintain a stoichiometric state.

In conclusion, the present invention enables the formation of thin layers with high uniformity and reproducibility. Because the thin layers are formed to a small thickness of about 10 to several hundred nm, a high-integrated high-speed electronic circuit can be easily embodied. Further, owing to a signal amplification effect caused by light scattering, it is possible to obtain an amplifier that can amplify signals at least 60 times as much as conventional bipolar transistors.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of fabricating a structure for an optical device, comprising:
   forming a first protective layer on a substrate by depositing one of oxide and nitride;
   forming a first capping layer on the first protective layer by depositing a material, which is doped with one selected from the group consisting of Si, Ta, W, Zn, Be, Li, and Al;
   forming a light scattering layer on the first capping layer by depositing nitride-oxide;
   forming a second capping layer on the light scattering layer by depositing a material, which is doped with one selected from the group consisting of Si, Ta, W, Zn, Be, Li, and Al;
   thermally treating the resultant structure to enable the generation of nanoparticles; and
   forming a second protective layer on the second capping layer by depositing one of oxide and nitride.

2. The method according to claim 1, wherein the oxide for forming the first and second protective layers is one of $Zn_{1-x}O_x$ and $Al_{1-x}O_x$, and the nitride for forming the first and second protective layers is one of SiN and $Ga_{1-x}N_x$.

3. The method according to claim 1, wherein the material, which is doped with one selected from the group consisting of Si, Ta, W, Zn, Be, Li, and Al, is one of $M_{1-y}((SiNO)_x)_y$, $M_{1-y}(Zn_{1-x}O_x)_y$, $M_{1-y}(Al_{1-x}O_x)_y$, and $M_{1-y}(Ga_{1-x}N_x)_y$.

4. The method according to claim 1, wherein the nitride-oxide is $(MN)_{1-x}O_x$ (M=Si, Ta, W, Zn, Be, Li, Al).

5. The method according to claim 1, wherein the thermal treatment is performed at a temperature of about 200 to 850.degree. C. in an atmosphere of nitrogen, oxygen, and argon.

6. The method according to claim 1, wherein forming the first protective layer through forming the second protective layer are performed in-situ.

* * * * *